(12) United States Patent
Bauer et al.

(10) Patent No.: US 8,110,962 B2
(45) Date of Patent: Feb. 7, 2012

(54) MEMS COMPONENT AND METHOD FOR PRODUCTION

(75) Inventors: Christian Bauer, Munich (DE); Hans Krueger, Munich (DE); Werner Ruile, Munich (DE); Alois Stelzl, Munich (DE)

(73) Assignee: Epcos AG, Munich (DE)

( * ) Notice: Subject to any disclaimer, the term of this patent is extended or adjusted under 35 U.S.C. 154(b) by 40 days.

(21) Appl. No.: 12/642,357

(22) Filed: Dec. 18, 2009

(65) Prior Publication Data
US 2010/0148285 A1 Jun. 17, 2010

Related U.S. Application Data

(63) Continuation of application No. PCT/EP2008/057502, filed on Jun. 13, 2008.

(30) Foreign Application Priority Data

Jun. 20, 2007 (DE) .................. 10 2007 028 288

(51) Int. Cl.
 *H01L 29/84* (2006.01)
(52) U.S. Cl. .................. 310/320; 310/321; 257/416
(58) Field of Classification Search .................. 310/320, 310/321; 257/416
See application file for complete search history.

(56) References Cited

U.S. PATENT DOCUMENTS

| | | | |
|---|---|---|---|
| 3,887,887 A | 6/1975 | Wagers et al. | |
| 4,500,807 A | 2/1985 | Yuhara et al. | |
| 6,140,144 A * | 10/2000 | Najafi et al. | 438/53 |
| 6,839,108 B1 * | 1/2005 | Hirakata et al. | 349/114 |
| 6,882,249 B2 | 4/2005 | Takamine et al. | |
| 6,982,380 B2 | 1/2006 | Hoffmann et al. | |
| 7,388,281 B2 | 6/2008 | Krueger et al. | |
| 2003/0062972 A1 * | 4/2003 | Kundu | 333/202 |
| 2005/0034888 A1 * | 2/2005 | Hoffmann et al. | 174/52.4 |
| 2009/0127697 A1 * | 5/2009 | Pahl | 257/698 |
| 2009/0155955 A1 * | 6/2009 | Liang | 438/108 |

FOREIGN PATENT DOCUMENTS

| | | |
|---|---|---|
| DE | 28 45 610 B1 | 7/1979 |
| DE | 37 29 014 A1 | 3/1989 |
| DE | 44 00 117 A1 | 7/1995 |
| DE | 100 56 716 A1 | 5/2002 |
| DE | 101 64 494 A1 | 7/2003 |
| DE | 102 38 523 A1 | 3/2004 |
| EP | 1 168 612 A2 | 1/2002 |
| WO | WO 03/037781 A1 | 5/2003 |

* cited by examiner

*Primary Examiner* — Walter Benson
*Assistant Examiner* — Bryan Gordon
(74) *Attorney, Agent, or Firm* — Slater & Matsil, L.L.P.

(57) ABSTRACT

A MEMS component includes a chip that has a rear side having a low roughness of less than one tenth of the wavelength at the center frequency of an acoustic wave propagating in the component. Metallic structures for scattering bulk acoustic waves are provided on the rear side of the chip and a material of the metallic structures is acoustically matched to a material of the chip.

17 Claims, 3 Drawing Sheets

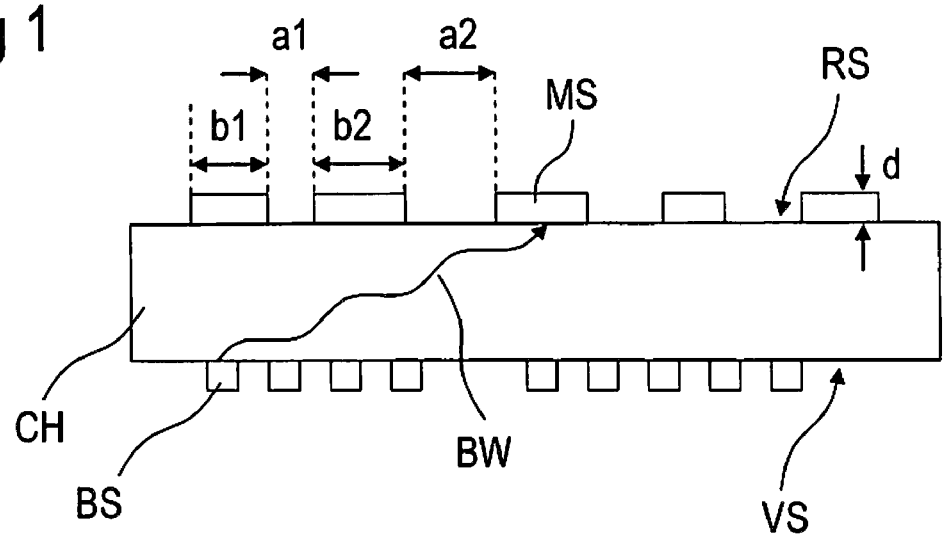
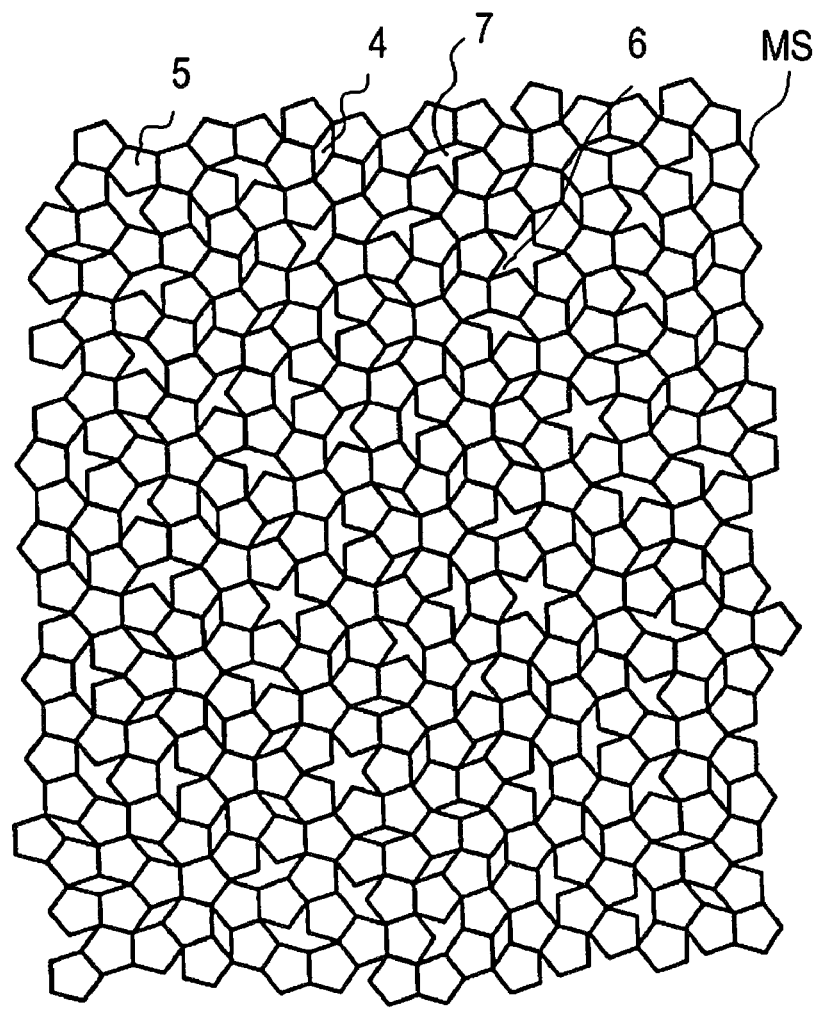

MEMS COMPONENT AND METHOD FOR PRODUCTION

This application is a continuation of co-pending International Application No. PCT/EP2008/057502, filed Jun. 13, 2008, which designated the United States and was not published in English, and which claims priority to German Application No. 10 2007 028 288.7 filed Jun. 20, 2007, both of which applications are incorporated herein by reference.

TECHNICAL FIELD

The invention relates to an MEMS component (Micro-Electro Mechanical System), wherein disturbing bulk acoustic waves can occur.

BACKGROUND

Bulk acoustic waves occur as leaky waves of a surface acoustic wave component, SAW component, constructed on a substrate that promotes leaky waves. These bulk waves concomitantly generated by the component structures can be reflected back, by reflection at the rear side of the chip on which the component is constructed, into the acoustically active component structures, where they can generate interference signals. This problem is intensified in the course of miniaturization, involving transition to thinner chips and thus a smaller component height, or when chips are ground and thus thinned from the rear side in a late fabrication stage. As the chip thickness decreases, a higher proportion of bulk waves are reflected back into the component structures.

In order to avoid the rear-side reflection of bulk waves, hitherto the chip rear sides have been roughened or provided in a targeted manner, by sawing, grinding or etching, with structures which prevent a uniform reflection of the bulk wave and preferably scatter the bulk wave. However, such structures increase the fracture sensitivity, which additionally increases as the chip thickness decreases, with the result that, by way of example, from a chip thickness of only approximately 200 μm, only smooth rear sides can be used in order to avoid excessively high rejects during the production of the component.

SUMMARY

In one aspect, the present invention specifies a MEMS component in which the reflection of bulk waves at the chip rear side is reduced and which can be used even in the case of components which have a layer thickness minimized by a thinning of the chip.

A MEMS component is proposed which has a chip which bears component structures on a front side and which has a smooth rear side having a low roughness. The latter can amount to less than one tenth of the wavelength which corresponds to the center frequency of an acoustic wave capable of propagating in the component. Structures for scattering bulk acoustic waves are now provided on this rear side. In particular, the structures are fabricated from a material which is acoustically matched to the material of the chip.

With the aid of suitable structures, which are metallic, in particular, owing to the simpler production, it is possible to reduce or avoid the reflection of bulk acoustic waves at the smooth rear side of the chip. The structures can also comprise other and, e.g., also electrically non-conductive materials.

The smooth chip rear side has the advantage that the chips can be thinned to a minimal layer thickness during the production of the components without increased risk of fracture. This permits the production of components having a minimal structural height.

The use of materials which are acoustically reciprocally matched to one another for the metallic structures and the chip, which is usually a piezoelectric crystal, minimizes the acoustic impedance difference and makes it easier for the bulk acoustic wave to pass from the material of the chip into the metallic structure.

Acoustic matching is understood within the meaning of the invention as material selection that is optimized to the effect that both materials have acoustic impedances that are as close to one another as possible or even identical. Further acoustic matching and thus properties improved further are obtained if the propagation speed of the bulk acoustic waves in both materials is approximated to one another and as far as possible identical. The better the acoustic matching, the more easily the bulk acoustic wave can couple into the metallic structures, in which it can be either damped or scattered.

A suitable metallic structure having a high scattering capability is obtained with a metal structure having a random and therefore irregular pattern. Irregular patterns have the advantage that even in the case of scattering reflection of the bulk acoustic wave, the arising of constructive interference and thus of harmful reflected bulk wave components is avoided to the greatest possible extent.

In one possible configuration of a pattern metal structures are distributed on the rear side of the chip, on which surface regions occupied by metal and surface regions free of metal structures then alternate in an irregular order.

It is advantageous if the metal structures have a thickness which corresponds to an acoustic "antireflection" means. Such an antireflection means is obtained if bulk wave components reflected from the top side of the metal structures have a propagation time difference of $\lambda/2$ relative to the bulk waves reflected at the phase boundary between chip and metal structures, where $\lambda$ is the wavelength of the bulk acoustic wave in the chip. Such a propagation time difference is obtained with layer thicknesses whose thickness corresponds to $\lambda/4+n*\lambda/2$. In this case, n can represent an integer, which advantageously lies between 0 and 6. However, thicker layers are also possible, such that the following can also hold true for n: $0 \leq n \leq 15$.

The thickness $\lambda/4+n*\lambda/2$ has the advantage that all bulk acoustic waves of wavelength $\lambda$ which impinge within a specific angular range can be compensated for by destructive interference.

The metal structure can have average structure sizes of between 0.2 and $5\lambda$. Structure sizes in the lower range have the advantage that it is thereby possible to form a maximum roughness of the metal structure or a surface where it is possible to obtain a maximum number of alternating structures per unit length or area.

There is the possibility of choosing the average structure sizes to be between 0.25 and $0.5\lambda$. This has the advantage that wave components reflected at the structure edges of the metal structures lead to negative interference and further wave components can be extinguished in this way. This increases the range of possible impingement angles of the bulk acoustic waves within which reflection is reduced or avoided.

Solely from the standpoint of obtaining a maximum roughness of the surface with the aid of the metal structures, a metallic surface occupancy on the rear side of the chip of 40% to 60%, and, in particular, of 50% is advantageous. With surface occupancy of exactly 50%, it is possible to realize a maximum number of structures per unit length or area for given average structure sizes.

Further advantages are achieved if the surface regions not covered by metal on the rear side of the chip are covered by an acoustic damping composition, and, in particular, by an acoustically matched material, in particular, by a plastic composition. This can be acoustically matched by means of a filler. The acoustic damping composition can fill the interspaces between the metal structures. It is also possible, however, to apply the acoustic damping composition with a higher layer thickness, such that it both fills the interspaces and covers the metal structures.

The MEMS component proposed makes it possible to reduce the layer thickness of the chips to less than 200 μm, preferably to less than 150 μm, and in the process to use smooth chip rear sides which minimize the risk of fracture during the thinning of the chip during the processing of the thinned chip, without an increased proportion of bulk acoustic waves reflected from the rear side having to be accepted in the process.

An acceptable trade-off between increased risk of fracture and thus higher rejects and minimal structure height of the component can also be found at a layer thickness of 130 μm or less.

The component structures of the chip can realize an SAW component or a BAW (Bulk Acoustic Wave) component, both of which can generate interfering leaky waves that descend into the chip or substrate. However, it is also possible for the MEMS component to have other component structures which can likewise be disturbed by bulk acoustic waves. Therefore, the invention also finds application in the case of components whose electrical component properties are essentially defined by the spatial dimensions and which impermissibly alter the component specifications in the event of dimension fluctuations such as can occur on account of bulk acoustic waves.

A suitably acoustically matched metal for the metal structures is selected depending on the material of the chip. For a component operating with acoustic waves, lithium tantalate, for example, as a suitable material for the chip, has an acoustic impedance $Za2$ of 26.46 kg/m$^2$s, to which metals such as copper ($Za2$=25.95 kg/m$^2$s), chromium ($Za2$=26.72 kg/m$^2$s) or nickel ($Za2$=26.02 kg/m$^2$s) have good acoustic matching since they have a similar acoustic impedance. Therefore, MEMS components including a chip composed of lithium tantalate and a metal structure composed of copper, chromium or nickel or a combination of these metals are advantageous. Chromium additionally has the advantage that in this metal the propagation speed v of the acoustic wave at 3742.41 m/s is similar to that in lithium tantalate (v=3552.10 m/s).

A further piezoelectric material that is often used is lithium niobate having an acoustic impedance $Za2$=16.79 kg/m$^2$s. A pure metal that is well matched to the acoustic impedance of lithium niobate is titanium ($Za2$=14.08 kg/m$^2$s), for example.

However, it is also possible to obtain an acoustically matched metal by means of a corresponding alloy of individual metals having higher and/or lower acoustic impedance than the piezoelectric material. Layer systems of metals having different impedances are also suitable.

It is advantageous to combine the metallic structures together with other metallic structures elsewhere in the MEMS component or to produce them in a common method. Synergistic effects where the metal for the metallic structures on the chip rear side fulfills further advantageous functions for the MEMS component elsewhere are also advantageous.

MEMS components can be fixed on supports or carriers with integrated interconnections using a flip-chip design, by way of example. In this case, the chip has solderable contacts on its underside, which are connected to solderable connection pads on the top side of the carrier by means of suitable connecting structures that effect electrical and mechanical connection, and, in particular, by means of bumps. External electrical contacts can be provided on the underside of the carrier, the contacts being electrically conductively connected to the solderable connection pads.

The flip-chip arrangement has the advantage that, preferably, component structures arranged on the underside of the chip are enclosed between chip and carrier and thus mechanically protected against actions from the outside. In this case, the bump connections between carrier and chip serve as spacers that ensure a certain distance between carrier and chip. The free space between chip and carrier can additionally be closed off at the chip edges. One suitable method for this is a frame which is applied to the carrier and on which the chip can bear completely in such a way that its component structures are located within the space enclosed by the frame. It is advantageous, for example, to form such a frame in metallic fashion at least at its top side (bearing area of the chip) and to provide it with a planarized surface, in particular. It is then possible for the metal which is used for the production of the metallic structures on the rear side of the chip to be simultaneously used for sealing the separating joint between frame and chip edge by virtue of a metal closure being structured from the metal.

In this case, it is advantageous to provide the chip with a wetting metallization at the side edge at least in the region of the separating joint, which metallization can form a hermetically tight contact with a metal closure and thus enables a hermetic closure of the component structures embedded within the frame between chip and carrier.

The MEMS component is preferably applied on a ceramic carrier embodied as a multilayer substrate comprising at least two dielectric ceramic layers and a metallization plane arranged therebetween. The multilayer substrate is preferably a low-warpage or warpage-free LTCC material (Low Temperature Co-fired Ceramics) or an HTCC material (High Temperature Co-fired Ceramics). An electrical interconnection can be realized in the metallization plane. It is also possible to realize passive components such as resistances, inductances or capacitances by means of one or a plurality of metallization planes interconnected with one another. The components can also be connected to form circuits and networks and realize RF filters, for example.

By means of the connection technology mentioned, and, in particular, as a result of the bearing of the chip on a frame planarized at the surface, it is possible for a MEMS component also to be applied to a carrier that is warped after sintering and hence no longer planar, without increased forces being able to act on the chip as a result. Low-stress chip mounting on the carrier is also achieved if the height of the frame is matched to the bump height, the tensile forces which are produced by the contraction of the bumps during melting and act on the chip being minimized.

The frame, at least at its surface, preferably consists of a metal which can be applied simply and cost-effectively. The frame can also be applied as a screen printing structure onto the carrier and subsequently be provided with a thin metal layer.

A metal which can be applied simply and cost-effectively, e.g., by means of electrolytic methods is copper, for example. A chip that is mechanically sensitive on account of a small layer thickness is advantageously applied to a frame having a planarized surface and is additionally supported by supporting elements which are provided within the frame on the carrier and which have the same height as the frame.

Suitable patterns for the metal structure on the chip rear side can be obtained by an irregular distribution of separate metallization areas. Preferably, these areas have the small dimensions mentioned. Preferably, metalized areas having different sizes and different contours are combined to form an irregular pattern.

It is also possible, however, to realize an irregular pattern by means of a metal layer in which non-contiguous cutouts having different sizes and forms are provided. An irregular grating of contiguous metal structures is obtained in this way.

A suitable pattern is obtained by juxtaposing irregular polygons, for example, which, avoiding symmetries, form a type of Penrose pattern. In this case the polygon edges, depending on the patterning, can be embodied as a grating or as a trench pattern. The irregular polygons additionally have the advantage that the polygon sections running in rectilinear fashion form a multiplicity of possible edge angles with respect to one another, with the result that a uniform reflection direction is avoided and maximum scattering of the surface wave is obtained.

The metal structures can additionally have suitable and preferably varying edge angles. With suitable edge angles, the reflection can be influenced further and with the aim of maximum scattering or directional reflection into a region which lies outside the active component structures or in which penetration of reflected bulk waves is harmless.

On the basis of this standpoint, a further possible configuration of the metal structures consists in a pattern, which realizes a Bragg grating. Such a grating acts like a mirror with adjustable directional reflection and likewise enables bulk waves that impinge on the Bragg pattern to be reflected in a targeted manner in a specific direction that is safe for the component structures.

One suitable method for producing a metal structure on the rear side of the chip consists in photopatterning. For this purpose, in an advantageous manner, a resist is applied on the rear side and patterned to form a negative structure of the desired metal structure. In the surface regions of the rear side of the chip which are not covered by the patterned resist layer, a metal is then applied up to the desired layer thickness. The resist can subsequently be removed. However, it is also possible to leave the resist as a damping surface coating in the interspaces between the metal structures.

The metallization can be effected in two steps, wherein a basic metallization is firstly applied to the chip and is subsequently reinforced electrolytically or in electroless fashion. The basic metallization can be applied after the production of the resist structure, for example, by vapor deposition, sputtering or by applying seeds from a solution, for example, by treatment with an activation solution containing palladium ions.

However, it is also possible to apply the basic metallization to the chip rear side over the whole area before the production of the resist structure and subsequently to reinforce it, e.g., electrolytically or in electroless fashion, with the aid of the resist structure only at the locations in which a metal pattern is intended to arise. The basic metallization, preferably applied with minimal layer thickness, can remain on the rear side in this case. However, it is also possible, after the removal of the resist structure, to remove the basic metallization again in the surface regions that are then free of the resist structure, for example, by means of an etching step.

The basic metallization can comprise a metal which is not acoustically matched. Up to a minimal layer thickness in the range of a few nanometers, the basic metallization is acoustically irrelevant and is not seen by an impinging bulk wave and therefore has no effect acoustically and therefore with respect to the reflection.

It is advantageous to apply the resist with a uniform layer thickness. For this purpose, resist films can be used, in particular, which can be laminated onto the rear side of the chip. It is possible in this case to match the thickness of the resist layer to the thickness of the metal structure to be produced. The metallization process can then be performed until the gaps between the resist structures have been completely filled with metal.

The resist can be a photoresist, which can be patterned by exposure and development. However, it is also possible to pattern a resist by means of a further photoresist. Furthermore, it is possible to pattern the resist directly by ablation by means of a laser. This is of interest particularly for resist structures and thus metal patterns which, as line patterns, are composed of a multiplicity of rectilinear sections.

BRIEF DESCRIPTION OF THE DRAWINGS

The invention is explained in more detail below on the basis of exemplary embodiments and associated figures. The figures have been drawn up as purely schematic and are therefore not to scale. Consequently, neither absolute nor relative quantitative indications can be inferred from them.

FIG. 1 shows a MEMS component comprising metal structures in schematic cross section;

FIGS. 2 to 4 show possible patterns for the metal structures in plan view; and

DETAILED DESCRIPTION OF ILLUSTRATIVE EMBODIMENTS

FIG. 1 shows an MEMS component in schematic cross section, this component being embodied here as an SAW component. The component comprises a chip CH, which is formed from a piezoelectric material, and, for example, a piezo-crystal, and, for example, of lithium tantalate or lithium niobate. Acoustically active component structures BS are arranged on the front side VS of the chip. A metal structure MS is arranged on the rear side RS of the chip CH. The metal structure constitutes an irregular pattern. The pattern is distinguished, in particular, by the fact that the width b of the structures, the distances a between the structures and also the edge angles of the metal structures MS are chosen differently. The following holds true for the first three metal structures MS from the left in the figure, for example, for the widths b: $b1 \neq b2$ and for the distances a: $a1 \neq a2$. The metal structure is embodied in such a way that approximately 50% of the rear side RS is occupied by metal structures MS. The metal structures MS are composed of an acoustically matched material having an acoustic impedance which is as close as possible to that of the chip CH.

In the present case, the MEMS component operates with surface waves that are guided as intended along the front side VS of the chip. Part of the energy coupled in via the component structures BS can, however, also be converted into bulk waves BW that descend into the piezo-material of the chip CH and can run as far as the rear side RS of the chip. Without special measures at the rear side, such a bulk wave BW is reflected at the rear side and can return into the component structures BS, where it is converted back into an electrical signal again, but this signal is not the proper signal and therefore constitutes an interference signal.

If the surface is then at least partly occupied by acoustically matched material, here by the metal structure MS, then the wave can enter into this metal structure. Within the metal structure, the wave is only reflected at the surface or side edges of the metal structure. The irregular pattern of the metal structure MS then leads, even in the case of bulk waves completely reflected by the metal structure, to a scattering of the wave, which then produce in the component structures BS noise at best, but no longer, in any event, an interference signal. Preferably, however, the bulk wave is absorbed within the metal structure or within a damping layer (not illustrated in the figure) that is arranged above and/or between the metal structures. The thickness d and the width b of the metal structures are preferably embodied such that reflected bulk waves interfere with the bulk waves which are reflected at the interface between chip CH and metal structure MS and thus extinguish one another.

Figure 4:
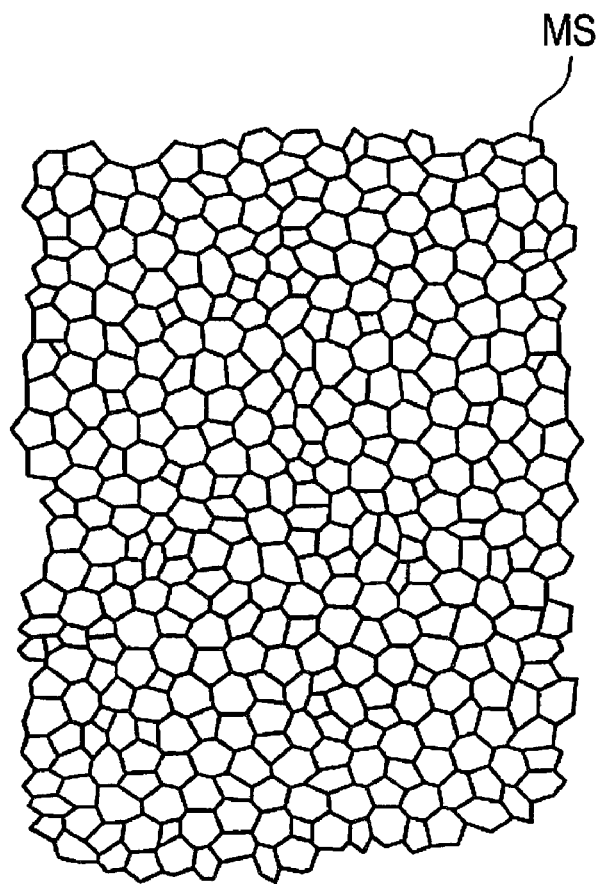

FIG. 4 shows a possible pattern for the metal structure MS in plan view. The area provided with the metal structure MS is parqueted with triangles, quadrangles, pentagons, hexagons, heptagons and octagons without any gaps. Interior angles exceeding 180° are avoided here. The polygons are so irregular that the grid has no symmetry whatsoever. The polygons in turn are intrinsically so irregular that they have different interior angles and different edge lengths. The same correspondingly holds true for adjacent polygons respectively distinguished by a common edge. The pattern illustrated can be a pattern of depressions or a positive pattern, in which the polygon edges constitute an elevated grating of metal structures.

FIG. 2 shows a possible configuration of the pattern in the form of a Penrose pattern on the basis of regular pentagons. The latter are arranged in such a way that each section of the grid is the side of one of the pentagons. The pentagons do not overlap and no further pentagon can be inserted into the interspaces between the pentagons without overlaps. The pentagons are linked together in such a way that the midpoints of two respective pentagons can be connected by a continuous curve that runs completely within pentagons and sides. The curve therefore contains only points which belong to a pentagon and are not corner points of a pentagon. To put it another way, the arrangement is one in which two respective pentagons are connected to one another by a chain of pentagons without any gaps, wherein each two successive pentagons of this chain have a common side and two adjacent pentagons which have common edge points either have a common edge or touch at a common corner point, wherein a side of one pentagon which is delimited by the corner point and a side of the other pentagon which is delimited by the corner point exist which are oriented at an angle of not equal to 180° with respect to one another. These sides can then simultaneously be the sides of a third pentagon.

As shown in FIG. 2, the entire grid is composed of four different polygons, namely the abovementioned pentagons 5, rhombi 4, star-shaped decagons 6 and boat-shaped heptagons 7, which are composed of a trapezoid and an isosceles triangle attached to the longer parallel side.

Figure 3:
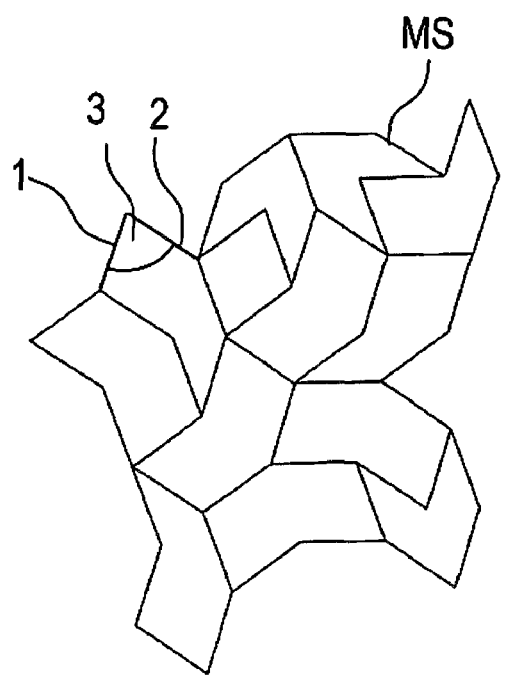

Basic elements of further Penrose patterns which can be employed for the configuration of the metal structures according to the invention are two types of rhombi. One type has interior angles of 36° and 144°, and the other type has interior angles of 72° and 108°. The side lengths are identical in each case. When such rhombi are placed alongside one another to form larger polygons this results in a type of five-fold symmetry. Such a grid pattern can be used for an irregularly patterned metal structure. It is advantageous in this case however, if not more than three sides abut at a point. FIG. 3 shows one possible arrangement of such a juxtaposition of different rhombi. The pattern illustrated in FIG. 3 is composed, without any gaps, of a rhombus having an interior angle of 72° and twelve hexagons composed of in each case two rhombi with an angle of 36° and/or an angle of 72° (angle 3, for example, equals 72°). Thus, the side lengths (e.g. 1, 2) of each side of each hexagon are equal.

However, a plurality of further randomized and therefore irregular patterns are suitable for the metal structure MS, which are distinguished overall by the fact that bulk wave reflections that are possibly effected at structure edges are effected over a wide angular range since a plurality of angles can occur between the edges of adjacent structures.

Figure 5:
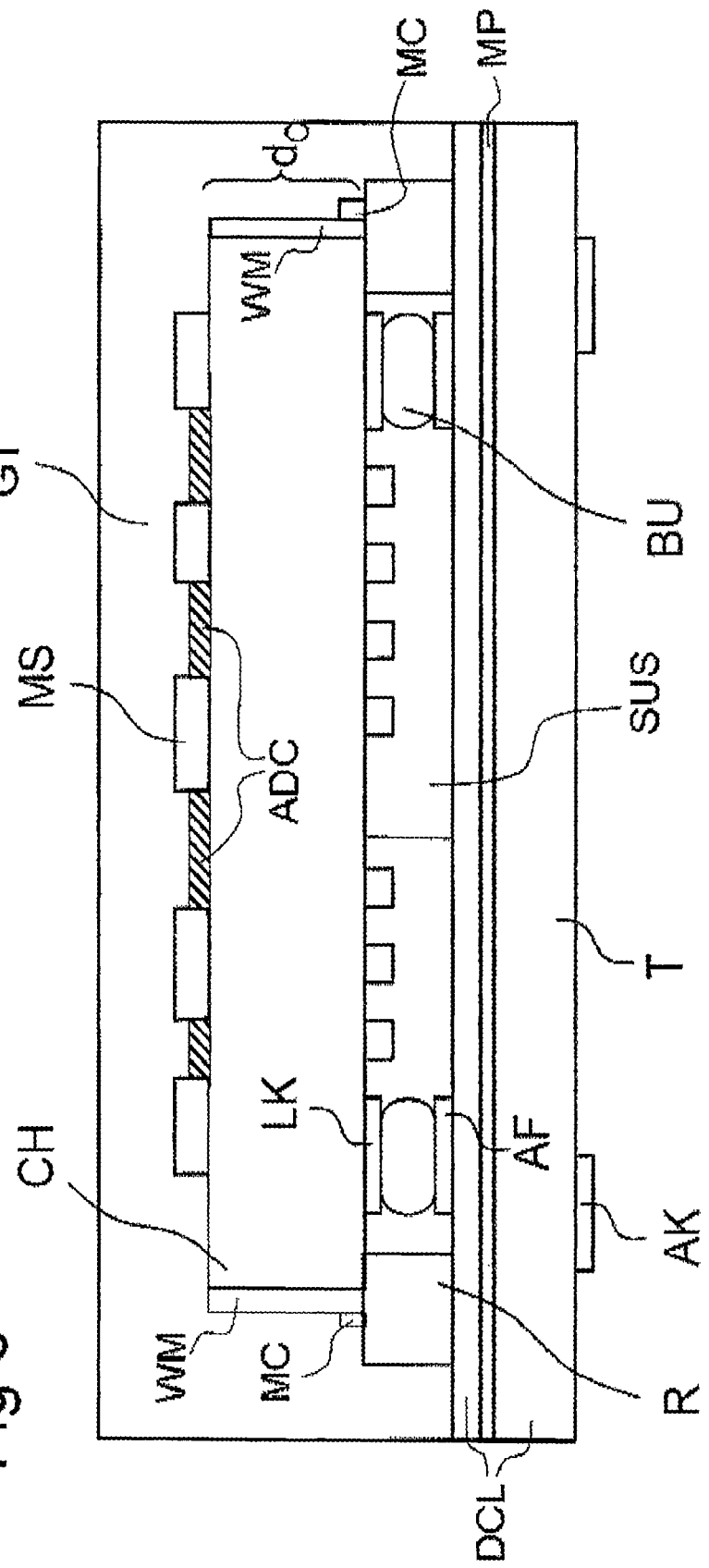
FIG. 5 shows a further MEMS component in cross section.

FIG. 5 shows an MEMS component illustrated in greater detail, wherein a chip CH is mounted onto a carrier T using flip-chip technology. The mechanical and electrical connections between carrier T and chip CH are effected by means of bumps BU which connect solderable contacts LK on the chip front side to connection pads AF on the top side of the carrier T.

On the underside, the carrier has external contacts AK which are electrically connected by internal electrical connections through the carrier, preferably in the context of a multilayer metallization, to the connection pads AF and via the bumps BU to the solderable contacts and via further lines (not illustrated) to the component structures BS.

Preferably, the chip CH is provided with a minimal layer thickness $d_c$ in order overall to achieve a minimal structural height of the MEMS component. In such a case, low-stress mounting on the carrier can be affected with the aid of a frame R, which is arranged on the carrier T in such a way that it encloses a chip installation area and which has a planarized surface, on which the chip CH can bear in planar fashion. If the frame R is closed, then a cavity is enclosed between chip, frame and carrier, the component structures BS being arranged in the cavity. In the case of relatively large-area chips, it may be advantageous to provide in addition to the frame R within the chip installation location further supporting structures (see, e.g., supporting structure SUS) of the same height, which support and thus mechanically stabilize the chip at least one further point.

The risk of a chip thinned in this way being destroyed by fracture can be reduced by the chip being thinned from the rear side only after flip-chip mounting, for example, by means of grinding, e.g., by means of CMP (Chemical Mechanical Polishing). A flip-chip bonded chip preferably bearing on a frame and, if appropriate, further supporting elements is mechanically stabilized, with the result that an increased risk of fracture occurs neither as a result of the grinding nor as a result of the further processing for producing the metal structures MS.

For hermetically sealing the component structures, the joint between the chip and the frame R can additionally be sealed by a suitable sealing material being applied to frame and side edge of the chip at least in the joint region. One possibility consists in depositing a metal there and producing a metal closure MC in this way. In addition or as an alternative it is possible to completely cover the chip from the rear side with a plastic composition GT. FIG. 5 shows such a covering GT, also called globtop.

The invention is not restricted to the exemplary embodiments illustrated. The MEMS component can have other electromechanical component structures, which optionally also lie within the chip, but preferably such component structures which are disturbed electrically or mechanically by bulk acoustic waves. The pattern of the metal structures can deviate from the patterns illustrated and need not necessarily be composed of sections running in rectilinear fashion.

The finished component preferably comprises a flip-chip bonded chip CH, but can also be fixed on a support or a carrier in some other way, for example by means of adhesive bonding. Preferably, the chip is thinned to a minimal chip thickness $d_c$. However, it is also possible to use the metal structure MS in the case of thicker chips.

The MEMS component may include other features as illustrated with respect to FIG. 5. In one embodiment, an acoustic damping composition ADC may be arranged in the area between the metal structures MS on the rear side of the chip CH. Thus, non-metalized interspaces of the metallic structures MS are occupied by the acoustic damping composition ADC. Additionally, a joint between the frame R and the chip CH may be hermetically sealed by means of the metal closure MC including the same material as the metallic structures MS. In accordance therewith, the chip CH may include a wetting metallization WM at a side edge, at least in a region of the metal closure MC, and the metal closure MC may include tin and produce a hermetic connection between the frame R and the wetting metallization WM. The ceramic carrier T may be a multilayer substrate including at least two dielectric ceramic layers DCL and a metallization plane MP arranged therebetween. Again, the MEMS component may also include a supporting structure SUS arranged within and having the same height as the frame R, and further supporting the chip CH.

What is claimed is:

1. A MEMS component comprising:
   a chip that has a front side and a rear side, the rear side having a low roughness of less than one tenth of a wavelength at a center frequency of an acoustic wave propagating during ordinary use of the component;
   component structures on the chip; and
   metallic structures for scattering bulk acoustic waves disposed on the rear side of the chip including line patterns composed of a multiplicity of rectilinear sections, wherein a material of the metallic structures is acoustically matched to a material of the chip.

2. The MEMS component as claimed in claim 1, wherein the metallic structures have an irregular pattern.

3. The MEMS component as claimed in claim 1,
   wherein the component structures operate with acoustic waves and can be operated at or around the center frequency,
   wherein a layer thickness of the metallic structures corresponds to $\lambda/4+n\lambda/2$, where n is an integer where $0 \leq n \leq 15$ and $\lambda$ is the wavelength at the center frequency of the acoustic wave.

4. The MEMS component as claimed in claim 1, wherein the metallic structures have average structure sizes of between $0.2\lambda$ and $5\lambda$, where $\lambda$ is the wavelength corresponding to the center frequency.

5. The MEMS component as claimed in claim 1, wherein the rear side of the chip has a metal structure with a metallic surface occupancy of 40-60%.

6. The MEMS component as claimed in claim 1, wherein non-metalized interspaces of the metallic structures are occupied by an acoustic damping composition.

7. The MEMS component as claimed in claim 1, wherein the chip has a thickness of 200 μm or less.

8. The MEMS component as claimed in claim 1, wherein the chip realizes an SAW or BAW component.

9. The MEMS component as claimed in claim 8, wherein the chip comprises a lithium tantalate crystal and wherein the material of the metallic structures is Cu, Cr or nickel.

10. The MEMS component as claimed in claim 8, wherein the chip comprises a lithium niobate crystal and wherein the material of the metallic structures comprise Ti.

11. The MEMS component as claimed in claim 1, further comprising:
    solderable contacts on an underside of the chip;
    a ceramic carrier having external contacts on its underside;
    a frame arranged on a top side of the carrier, the frame enclosing a chip installation location and being metallic at least at a surface; and
    solderable connection pads arranged on the top side of the carrier within the frame, the connection pads being electrically connected to the external contacts,
    wherein the chip is seated by its underside on the frame and electrically and mechanically connected to the carrier by means of bump connections between the solderable contacts and the connection pads.

12. The MEMS component as claimed in claim 11,
    wherein a top side of the frame facing the chip is planarized, and
    wherein a joint between the frame and the chip is hermetically sealed by means of a metal closure comprising the same material as the metallic structures.

13. The MEMS component as claimed in claim 12,
    wherein the chip has a wetting metallization at a side edge, at least in a region of the metal closure, and
    wherein the metal closure comprises tin and produces a hermetic connection between the frame and the wetting metallization.

14. The MEMS component as claimed in claim 11, wherein the ceramic carrier is a multilayer substrate comprising at least two dielectric ceramic layers and a metallization plane arranged therebetween.

15. The MEMS component as claimed in claim 11, wherein the frame predominantly comprises copper.

16. The MEMS component as claimed in claim 11, wherein the frame comprises a sintered screen printing structure that is applied directly on the carrier and is metalized at its surface.

17. The MEMS component as claimed in claim 11, further comprising at least one supporting structure arranged within the frame, the at least one supporting structure having the same height as the frame and supporting the chip.

* * * * *